United States Patent
Kaiwa et al.

(10) Patent No.: US 9,018,973 B2
(45) Date of Patent: Apr. 28, 2015

(54) SEMICONDUCTOR DEVICE

(71) Applicant: Elpida Memory, Inc., Tokyo (JP)

(72) Inventors: Nakaba Kaiwa, Tokyo (JP); Yutaka Ikeda, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 142 days.

(21) Appl. No.: 13/644,388

(22) Filed: Oct. 4, 2012

(65) Prior Publication Data

US 2014/0097911 A1  Apr. 10, 2014

(30) Foreign Application Priority Data

Oct. 4, 2011 (JP) .................................. 2011-220077

(51) Int. Cl.
| | |
|---|---|
| *H03K 19/003* | (2006.01) |
| *H03H 7/40* | (2006.01) |
| *H04L 25/02* | (2006.01) |
| *H03K 21/38* | (2006.01) |

(52) U.S. Cl.
CPC ............. *H03H 7/40* (2013.01); *H04L 25/0278* (2013.01); *H03K 21/38* (2013.01)

(58) Field of Classification Search
USPC ............ 326/30, 82–83, 86–87; 327/108–109, 327/112; 324/601
See application file for complete search history.

(56) References Cited

U.S. PATENT DOCUMENTS

| | | | | |
|---|---|---|---|---|
| 7,230,448 | B2 * | 6/2007 | Choe ............................... | 326/30 |
| 7,656,186 | B2 * | 2/2010 | Osanai et al. ................... | 326/30 |
| 7,755,366 | B2 * | 7/2010 | Hosoe et al. .................. | 324/601 |
| 7,869,973 | B2 | 1/2011 | Yoko et al. | |
| 8,018,246 | B2 * | 9/2011 | Kaiwa et al. ..................... | 326/30 |
| 8,106,676 | B2 * | 1/2012 | Kaiwa et al. ..................... | 326/30 |
| 8,547,140 | B1 * | 10/2013 | Faucher et al. ................. | 326/83 |
| 2004/0008054 | A1 * | 1/2004 | Lesea et al. ..................... | 326/30 |
| 2008/0046212 | A1 | 2/2008 | Yoko et al. | |
| 2008/0054981 | A1 | 3/2008 | Hosoe et al. | |
| 2010/0045359 | A1 | 2/2010 | Yoko et al. | |
| 2010/0207680 | A1 * | 8/2010 | Kuwahara et al. ............ | 327/520 |
| 2012/0056641 | A1 * | 3/2012 | Kuroki et al. ................... | 326/30 |

FOREIGN PATENT DOCUMENTS

| | | |
|---|---|---|
| JP | 2008-048361 A | 2/2008 |
| JP | 2008-060629 A | 3/2008 |

* cited by examiner

*Primary Examiner* — Jason M Crawford
(74) *Attorney, Agent, or Firm* — McGinn IP Law Group, PLLC

(57) ABSTRACT

A device, comprising an output terminal; an output circuit coupled to the output terminal and having an adjustable impedance; and an impedance adjustment circuit adjusting stepwise the adjustable impedance so as to head toward a first reference impedance. The impedance adjustment circuit changes the adjustable impedance by a first amount when the adjustable impedance is within a first range, and changes the adjustable impedance by a second amount when the adjustable impedance is out of the first range. The first amount is smaller than the second amount.

8 Claims, 15 Drawing Sheets

SEMICONDUCTOR DEVICE

REFERENCE TO RELATED APPLICATION

This application is based upon and claims the benefit of the priority of Japanese patent application No. 2011-220077, filed on Oct. 4, 2011, the disclosure of which is incorporated herein in its entirety by reference thereto.

TECHNICAL FIELD

This invention relates to a semiconductor device and more specifically to a semiconductor device having a calibration circuit to adjust the impedance of an output buffer.

BACKGROUND

In these days, a very high data transfer rate is required of data transfer between different semiconductor devices, for example, between a CPU and a memory. To implement this, the amplitude of an input/output signal is becoming ever smaller. If the amplitude of the input/output signal becomes smaller, the requirement for precision in the impedance of the output buffer becomes extremely strict.

The output buffer impedance not only is fluctuated with variable process conditions at the time of manufacture but also is changed during the time of field use under the influences of changes in the ambient temperature or in the power supply voltage. For this reason, should high precision be required of the output buffer impedance, an output buffer having a function of impedance adjustment is used. Such impedance adjustment for the output buffer is performed using a circuit called a 'calibration circuit' in general.

A replica buffer having the same configuration as that of the output buffer is contained in the calibration circuit. In performing a calibration operation, a voltage appearing at a calibration terminal is compared to a reference voltage, in a state where an external resistor is connected to the calibration terminal, thereby adjusting the impedance of the replica buffer. The impedance of the output buffer is set at a desired value by having the adjustment contents of the replica buffer reflected in the output buffer.

In the sequence of the calibration operations, a plurality of adjustment operations, each including the steps of voltage comparison and update of the impedance of the replica buffer, are carried out, thereby causing the impedance of the output buffer to approach towards a desired value.

However, the voltage comparison or the change in the impedance of the replica buffer in the calibration operation takes some time. Thus, if the external clock frequency is high, it is not possible to execute an adjustment operation each time an external clock is activated. In such case, it may be feasible divide the frequency of the external clock to generate an internal clock of a lower frequency and to execute the adjustment operation in synchronization with the lower frequency achieved. For such a case that, in connection with such calibration circuit, the number of the adjustment operations that may be carried out in one calibration time interval is small, there is disclosed in Patent Literatures 1 and 2 a technique that allows impedance adjustment to be performed more reliably.

Patent Literature 1

JP Patent Kokai Publication No. JP2008-48361A, which corresponds to US2008/046212A1, U.S. Pat. No. 7,869,973B2 and US2010/045359A1

Patent Literature 2

JP Patent Kokai Publication No. JP2008-60629A, which corresponds to US2008/054981A1 and U.S. Pat. No. 7,755,366B2

SUMMARY

The disclosures of the above Patent Literatures are incorporated herein in their entirety by reference thereto. The following analysis is given by the present disclosure.

It is observed that, in case the frequency of the external clock signal has become further higher, the number of the adjustment operations that may be executed within a pre-set calibration time interval becomes further smaller. In such case, it may be feared that, in the related technique, the calibration may not be completed reliably within the pre-set calibration time interval. Thus there is much to be desired in the art.

In one aspect (phase) of the present disclosure, there is provided a device comprising an output terminal; an output circuit coupled to the output terminal and having an adjustable impedance; and an impedance adjustment circuit adjusting stepwise the adjustable impedance so as to head toward a first reference impedance. The impedance adjustment circuit changes the adjustable impedance by a first amount when the adjustable impedance is within a first range, and changes the adjustable impedance by a second amount when the adjustable impedance is out of the first range. The first amount is smaller than the second amount.

In another aspect (phase) of the present disclosure, there is provided a device comprising an output terminal; a first output circuit connected to the output terminal and being indicative of a first impedance; and an impedance adjustment circuit. The impedance adjustment circuit includes a first terminal, a first replica circuit, a reference voltage generation circuit, a plurality of first comparator circuits and a first adjustment signal generation circuit. The replica circuit is coupled to the first terminal and is indicative of an first replica impedance. The reference voltage generation circuit generates a plurality of reference voltages that are different in potential level from each other. Each of the first comparator circuits includes first and second input nodes.

The first input node of each of the first comparator circuits is coupled to the first terminal. The second input node of each of the first comparator circuits receives an associated one of the reference voltages. The first comparator circuits output a plurality of first comparison result signals. The first adjustment signal generation circuit receives the first comparison result signals, generates first impedance adjustment signals and supplies the first impedance adjustment signals to the first output buffer and the first replica circuit. The first output buffer changes the first impedance in response to the first impedance adjustment signals. The first replica circuit changes the first replica impedance in response to the first impedance adjustment signals.

In still another aspect (phase) of the present disclosure, there is provided a device, comprising an output terminal; an output means for outputting an output signal to the output terminal and having an adjustable impedance; and an impedance adjustment means for adjusting stepwise the adjustable impedance so as to head toward a first reference impedance.

The impedance adjustment means changes the adjustable impedance by a first amount when the adjustable impedance is within a first range, and changes the adjustable impedance by a second amount when the adjustable impedance is out of the first range. The first amount being smaller than the second amount.

According to the present invention, calibration can be completed with a number of operations lesser than in the legacy technique.

PREFERRED MODES

Certain preferred Exemplary Embodiments will now be described in detail with reference to the drawings.

Exemplary Embodiment 1

Figure 1:
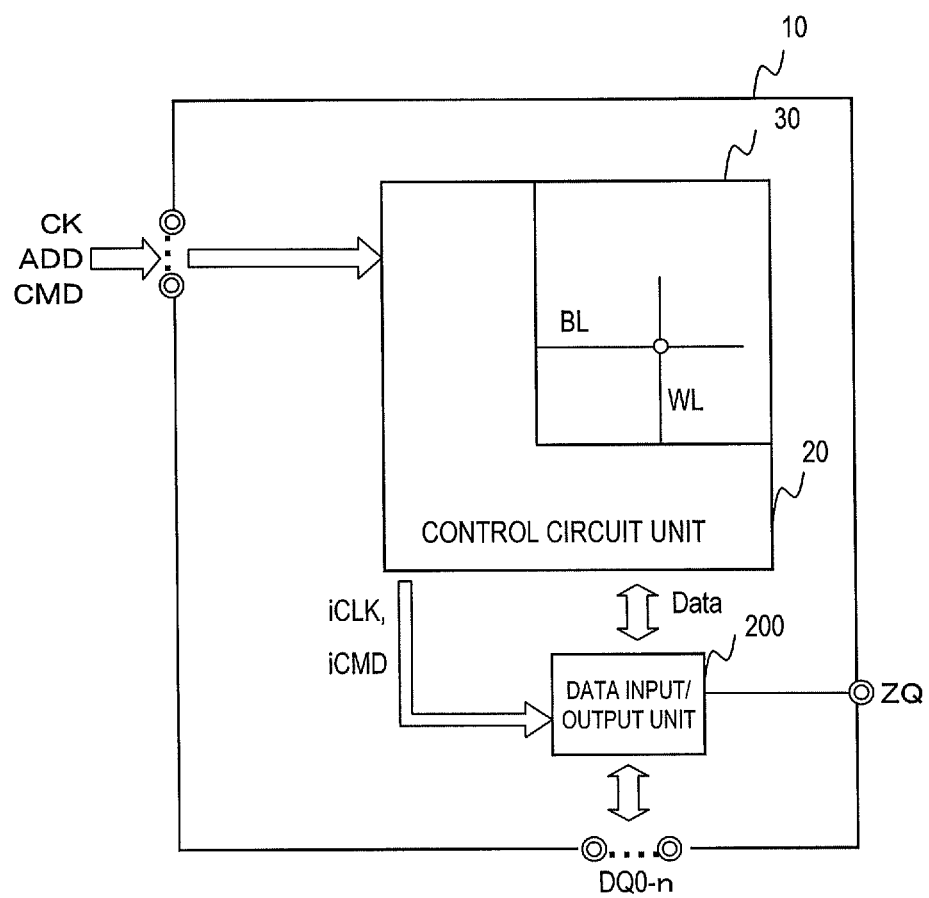
FIG. 1 is a block diagram showing a configuration of a semiconductor device according to an Exemplary Embodiment of the present disclosure.

FIG. 1 depicts a block diagram showing a configuration of a semiconductor device according to an Exemplary Embodiment of the present disclosure. In FIG. 1, a semiconductor device 10 is a DRAM, for example, and includes a control circuit 20, a memory cell array 30, a data input/output unit 200, input terminals CK, ADD, CMD, that is, input terminals for a clock signal, an address signal and a command signal, data input/output terminals DQ0 to DQn, and a calibration terminal ZQ.

The control circuit 20 activates a word line WL and a bit line BL, based on the clock, address and command signals, to access a memory cell in the memory cell array 30 corresponding to a point of intersection of the word line WL and the bit line BL which are now in activated state. In case the command signal is a readout related command (read command), the data of the memory cell accessed is output via the data input/output unit 200 to the data output/output terminals DQ0 to DQn. In case the command signal is a write related command (write command), the data input to the data input/output terminals DQ0 to DQn are fetched via the data input/output unit 200 into the control circuit 20 and written in the memory cell accessed.

The data input/output unit 200 is configured to perform input/output operation in response to a clock signal iCLK and a command signal iCMD from the control circuit 20, and is configured to adjust the output impedance of an output buffer thereof in keeping with the external impedance of the calibration terminal ZQ.

Figure 2:
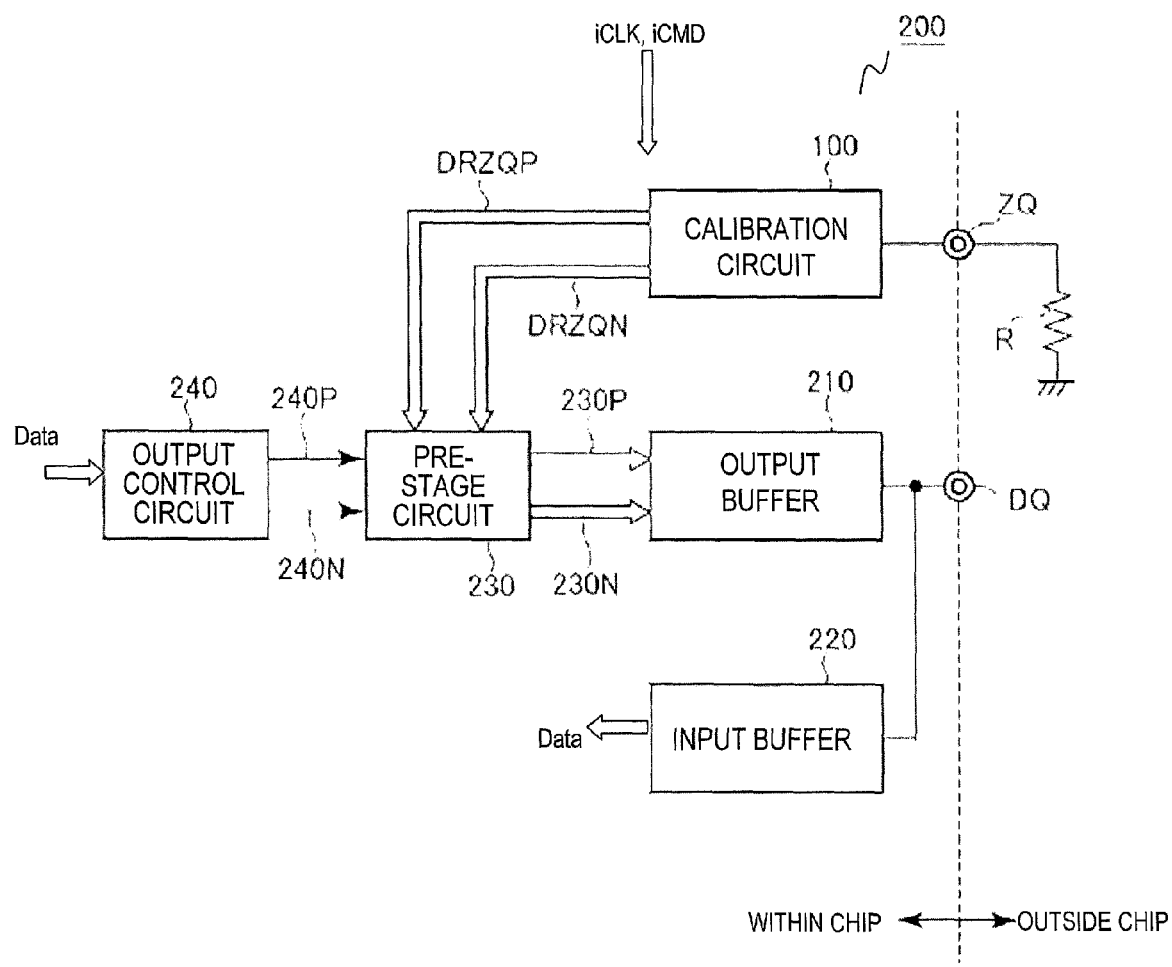
FIG. 2 is a block diagram showing the configuration of a data input/output unit according to the Exemplary Embodiment of the present disclosure.

As shown in FIG. 2, the data input/output unit 200 includes a calibration circuit 100, an output buffer 210, an input buffer 220, a pre-stage circuit 230 and an output control circuit 240.

The calibration circuit 100 initiates adjustment of the output impedance of the output buffer 210 in response to a command signal iCMD that instructs execution of the calibration operation. The calibration circuit 100 has the function to adjust the amount of change (pitch of change) of the output impedance at one adjustment operation. Preferably, the calibration circuit adjusts the pitch of change of the output impedance to be narrower in a time range following a time range directly after the start of the output impedance adjustment than in the time range directly after the start of the output impedance adjustment. The calibration circuit selectively activates, based on the resistance value of a resistor R connected externally to the calibration terminal ZQ, one or ones of impedance control signals in each of impedance control signal sets DRZQP and DRZQN, and outputs the impedance control signal sets DRZQP and DRZQN to the pre-stage circuit 230. The calibration circuit 100 will be set out in detail subsequently.

The output control circuit 240 receives a data signal Data outputted from the control circuit 20, and sets the levels of selection signals 240P, 240N to H level or to L level, in keeping with the logical level of the data signal Data. The output control circuit outputs the resulting signals to the pre-stage circuit 230.

The pre-stage circuit 230 activates one of operating signal sets 230P, 230N, in keeping with the logic levels of the signals 240P, 240N, to output the activated operating signal sets to the output buffer 210. It is observed that the impedance control signal sets DRZQP and DRZQN are supplied from the calibration circuit 100. The number of the activated signals in one of the activated operating signal set 230P, 230N is determined in accordance with the numbers of activated signals of the impedance control signal sets DRZQP, DRZQN. The pre-stage circuit 230 will be discussed in detail subsequently.

The output buffer 210 controls the ability to drive a data input/output terminal DQ in accordance with the number of the activated signals in the operating signal set 230P or 230N delivered from the pre-stage circuit 230. That is, the output buffer adjusts the output impedance for the data input/output terminal DQ such as to deliver an output signal corresponding to the data signal Data. The output buffer 210 will be discussed in detail subsequently.

The input buffer 220 buffers an input signal from the data input/output terminal DQ to output the so buffered signal as data signal Data to the control circuit 20. It is observed that the configuration of the input buffer 220 has no direct relevance to the gist of the present invention and hence is not discussed herein in detail.

Figure 3:
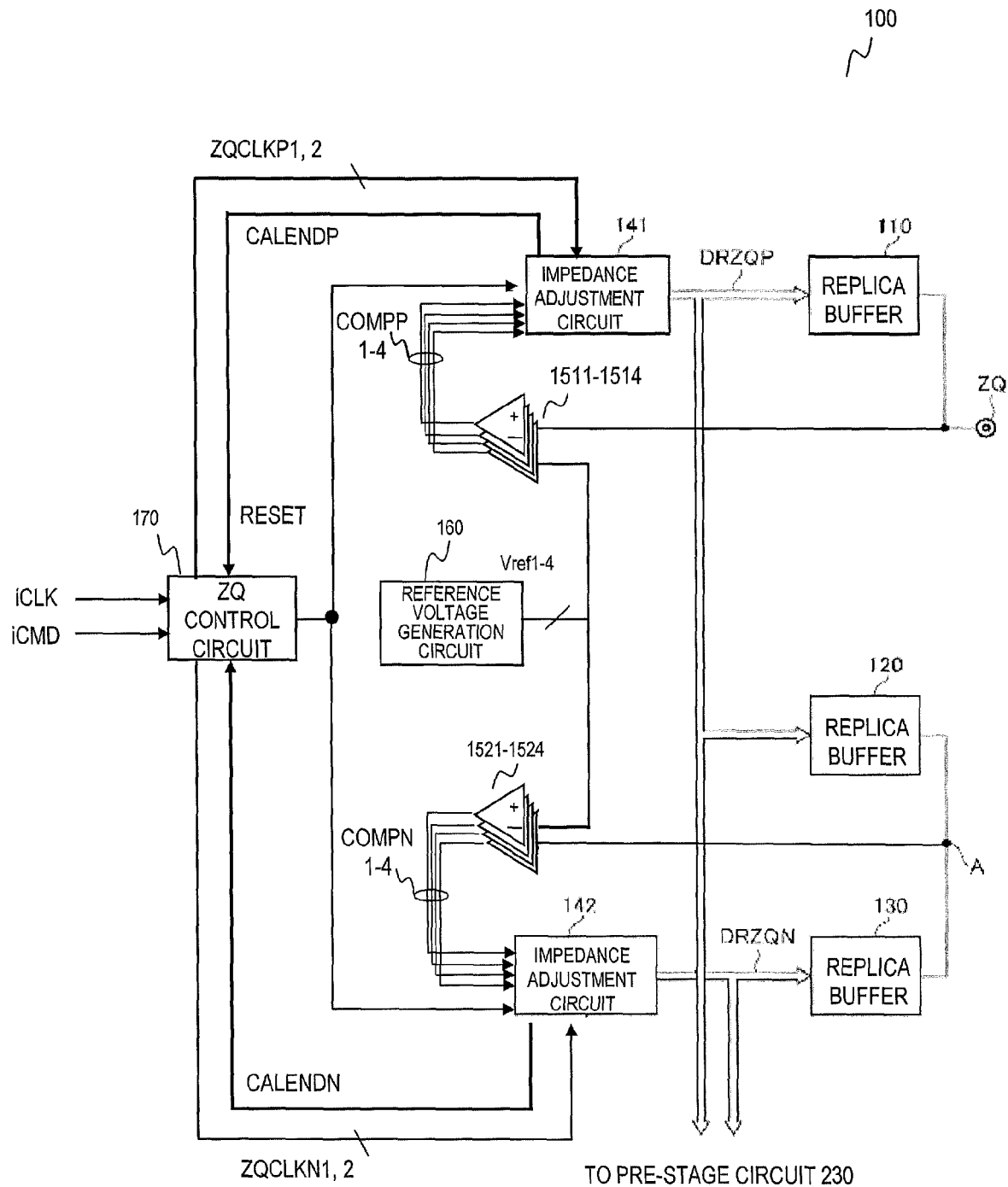
FIG. 3 is a circuit diagram showing the configuration of a calibration circuit according to the Exemplary Embodiment of the present disclosure.

As shown in FIG. 3, the calibration circuit 100 includes replica buffers 110, 120, 130, impedance adjustment circuits 141, 142, a plurality of comparator circuits 1511 to 1514, a plurality of comparator circuits 1521 to 1524, a reference voltage generation circuit 160, a ZQ control circuit 170 and a calibration terminal ZQ.

The replica buffer 110 drives the calibration terminal ZQ with an output impedance conforming to the number of activated signals in the impedance control signal set DRZQP output by the impedance adjustment circuit 141. On the other hand, the replica buffer 120 drives a node A with an output impedance conforming to the number of activated signals in the impedance control signal set DRZQP output by the impedance adjustment circuit 141. Further, the replica buffer 130 drives the node A with an output impedance conforming to the number of activated signals in the impedance control signal set DRZQN output by the impedance adjustment circuit 142. The replica buffers 110, 120 and 130 will be discussed in detail subsequently.

The reference voltage generation circuit 160 generates reference voltages Vref1 to Vref4 to deliver these to the comparator circuits 1511 to 1514 and the comparator circuits 1521 to 1524. The reference voltages Vref1 to Vref4 are supplied to one comparator input terminals (−) of the comparator circuits 1511 to 1514, respectively and to one comparator input terminals (−) of the comparator circuits 1521 to 1524, respectively.

The voltage at the calibration terminal ZQ is input to each of the other comparator input terminals (+) of the comparator circuits 1511 to 1514, such that signals COMPP1 to COMPP4, the results of comparison, are output to the impedance adjustment circuit 141.

The voltage at the node A is input to each of the other comparator input terminals (+) of the comparator circuits 1521 to 1524, such that signals COMPN1 to COMPN4, the results of comparison, are output to the impedance adjustment circuit 142.

The impedance adjustment circuit 141 is initialized by a reset signal RESET. The count value of an own counter of the impedance adjustment circuit 141 is updated by clocking of ZQCLKP1, ZQCLKP2. The impedance adjustment circuit outputs the impedance control signal set DRZQP of a value that depends on the count value of the counter. When the COMPP1 to COMPP4 are at a pre-set level indicative of the end of the adjustment, the impedance adjustment circuit 141 stops the count operation to output an adjustment end signal CALENDP as well as to output the impedance control signal set DRZQP conforming to the stopped count value.

The impedance adjustment circuit 142 is initialized by the reset signal RESET. The count value of an own counter of the impedance adjustment circuit 142 is updated by clocking of ZQCLKN1, ZQCLKN2. The impedance adjustment circuit 142 outputs the impedance control signal set DRZQN of a value that depends on the count value of the counter. When the COMPN1 to COMPN4 are at a pre-set level indicative of the end of the adjustment, the impedance adjustment circuit 142 stops the count operation to output an adjustment end signal CALENDN as well as to output the impedance control signal set DRZQN conforming to the stopped count value. The impedance adjustment circuits 141, 142 will be discussed in detail subsequently.

In case the internal command iCMD, supplied from the control circuit 20 of FIG. 1, is a command ZQC indicating the execution of the calibration operation, the ZQ control circuit 170 commences clocking of one out of a set of ZQCLKP1, ZQCLKP2 and a set of ZQCLKN1, ZQCLKN2, in response to iCLK. In case the internal command is a command indicative of the resetting of the calibration circuit 100, the reset signal RESET is brought to an active level.

On reception of the adjustment end signal CALENDP (CALENDN) from the impedance adjustment circuit 141 (142), the ZQ control circuit 170 stops clocking of the set ZQCLKP1, ZQCLKP2 or the set ZQCLKN1, ZQCLKN2, whichever has thus far been clocking, thereby stopping the impedance adjustment operation thus far going on. It is also possible that, concurrently with the stop of clocking of one of the sets, the clocking of the other set is commenced. In more concrete terms, if the adjustment end signal CALENDP is supplied during the time of execution of the impedance adjustment on the Pch side in the replica buffers 110, 120, the impedance adjustment on the Nch side in the replica buffer 130 may be initiated by stopping the clocking of ZQCLKP1, ZQCLKP2 and initiating the clocking of ZQCLKN1, ZQCLKN2. If thereafter CALENDN is supplied, the clocking of ZQCLKN1, ZQCLKN2 is stopped. It is observed that, if CALENDN is supplied during the time of adjusting the impedance on the Nch side, clocking of ZQCLKP1, ZQCLKP2 may not be allowed to be initiated, thereby stopping the calibration operation.

Figure 4:
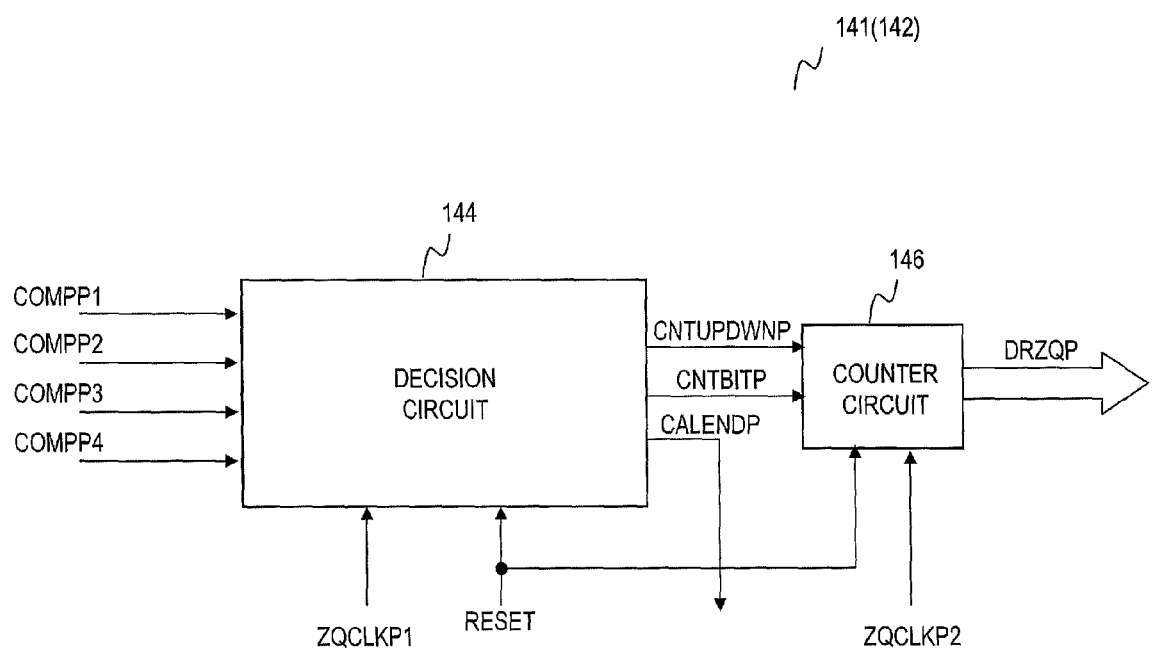
FIG. 4 is a block diagram showing an impedance adjustment circuit according to the Exemplary Embodiment of the present disclosure.

The impedance adjustment circuits 141, 142 will now be described. FIG. 4 depicts a circuit diagram of the impedance adjustment circuits 141 (142). Here, the configuration of the Pch side impedance adjustment circuit 141, in particular, is shown and explained. The configuration of the Nch side impedance adjustment circuit 142 is substantially the same as the Pch side circuit and may be achieved by simply reading the signals ZQCLKN1, ZQCLKN2, CALENDN, COMPN1 to COMPN4 and DRZQN1 to DRZQN4 for ZQCLKP1, ZQCLKP2, CALENDP, COMPP1 to COMPP4 and DRZQP1 to DRZQP4, respectively. It is observed that, in the Nch side impedance adjustment circuit 142, DRZQN1 to DRZQN4 need to be logically inverted before being delivered to the replica buffer 130 and to the pre-stage circuit 230.

Figure 5:
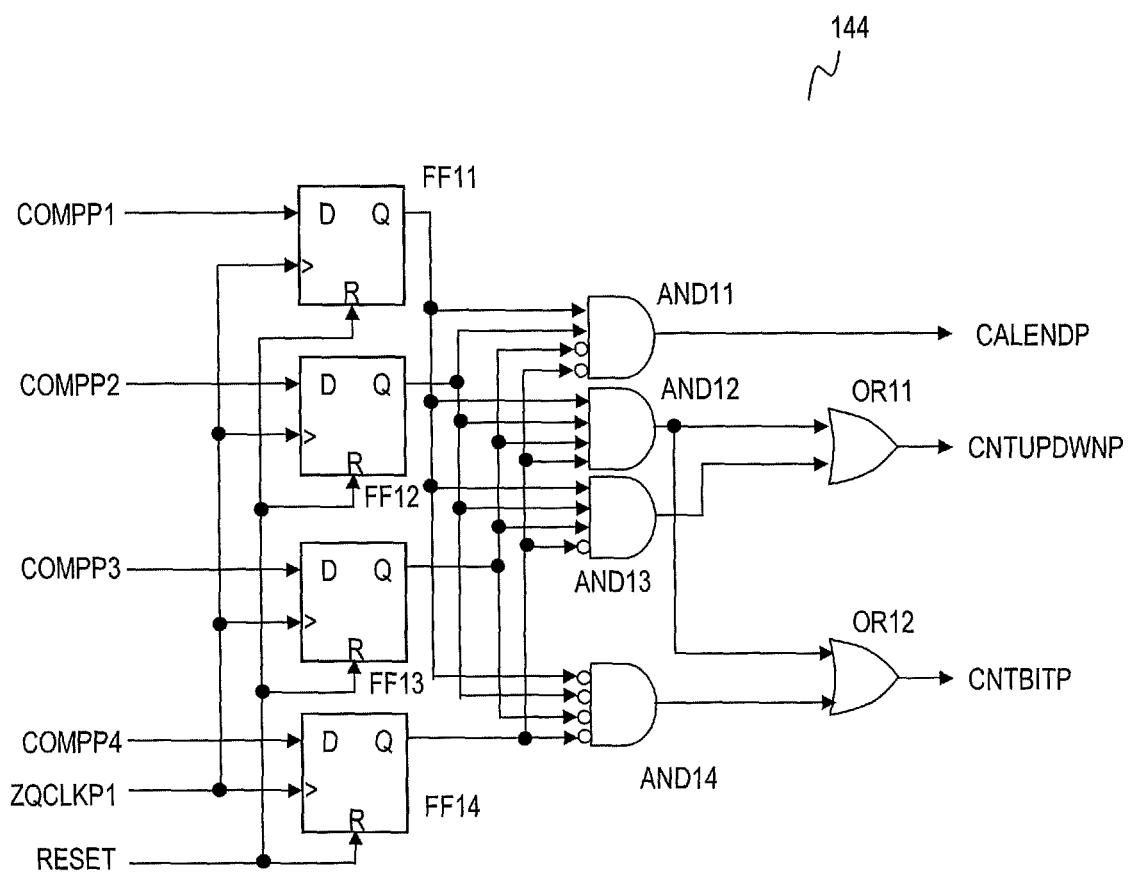
FIG. 5 is a circuit diagram of a decision circuit according to the Exemplary Embodiment of the present disclosure.

Each of the impedance adjustment circuits 141 (142) is provided with a decision circuit 144 and a counter circuit 146. FIG. 5 shows a circuit diagram of the decision circuit 144. In FIG. 5, each of flipflop circuits FF11 to FF14 is reset with the H level of a reset signal RESET to latch the signals COMPP1 to COMPP4 in response to the H level of the signal ZQCLKP1. An AND circuit AND11 performs an AND operation on outputs of the flipflop circuits FF11 and FF12 and logical inversions of outputs of the flipflop circuits FF13 and FF14 and outputs the signal CALENDP. An AND circuit AND12 performs the AND operation on outputs of the flipflop circuits FF11 to FF14 and outputs the result of the operation one input of an OR circuit OR11 and to one input of an OR circuit OR12. An AND circuit AND13 performs the AND operation on outputs of the flipflop circuits FF11 to FF13 and a logical inversion of the output of the flipflop circuits FF14 and outputs the result of the operation to the other input of the OR circuit OR11, which OR circuit OR11 then outputs a signal CNTUPDWNP. An AND circuit AND14 performs an AND operation on logical inversions of outputs of the flipflop circuits FF11 to FF14 and outputs the result of the operation to the other input of the OR circuit OR12, which OR circuit OR12 then outputs a signal CNTBITP.

The above described decision circuit 144 has the function to generate CALENDP, indicating whether or not the Pch side impedance adjustment has been finished, depending on the logical levels of the signals COMPP1 to COMPP4 that respectively indicate the results of comparison by the comparator circuits 1511 to 1514. The decision circuit 144 also has the function to generate CNTUPDWNP indicating whether the operation of the subsequent stage counter circuit 146 is countup or countdown, in short, indicating the direction of impedance adjustment. In addition, the decision circuit has the function of generating the signal CNTBITP indicating whether the subsequent counter circuit 146 changes counter value thereof by a one step (one bit) or a two step (two bit), viz., indicating the amount of change of the output impedance at one adjustment operation.

More specifically, the signals COMPP1 to COMPP4 being 'HHLL' indicates that CALENDP is H in level, with the impedance adjustment then being in finished state. The signals COMPP1 to COMPP4 being 'HHHL' or 'HHHH' indicate that CNTUPDWNP is H in level, with the operation of the counter 146 then being a countdown operation. The signals COMPP1 to COMPP4 being 'LLLL' or 'HHHH' indicates that CNTBITP is H in level, with the change in the counter circuit 146 being a two step change.

Figure 6:
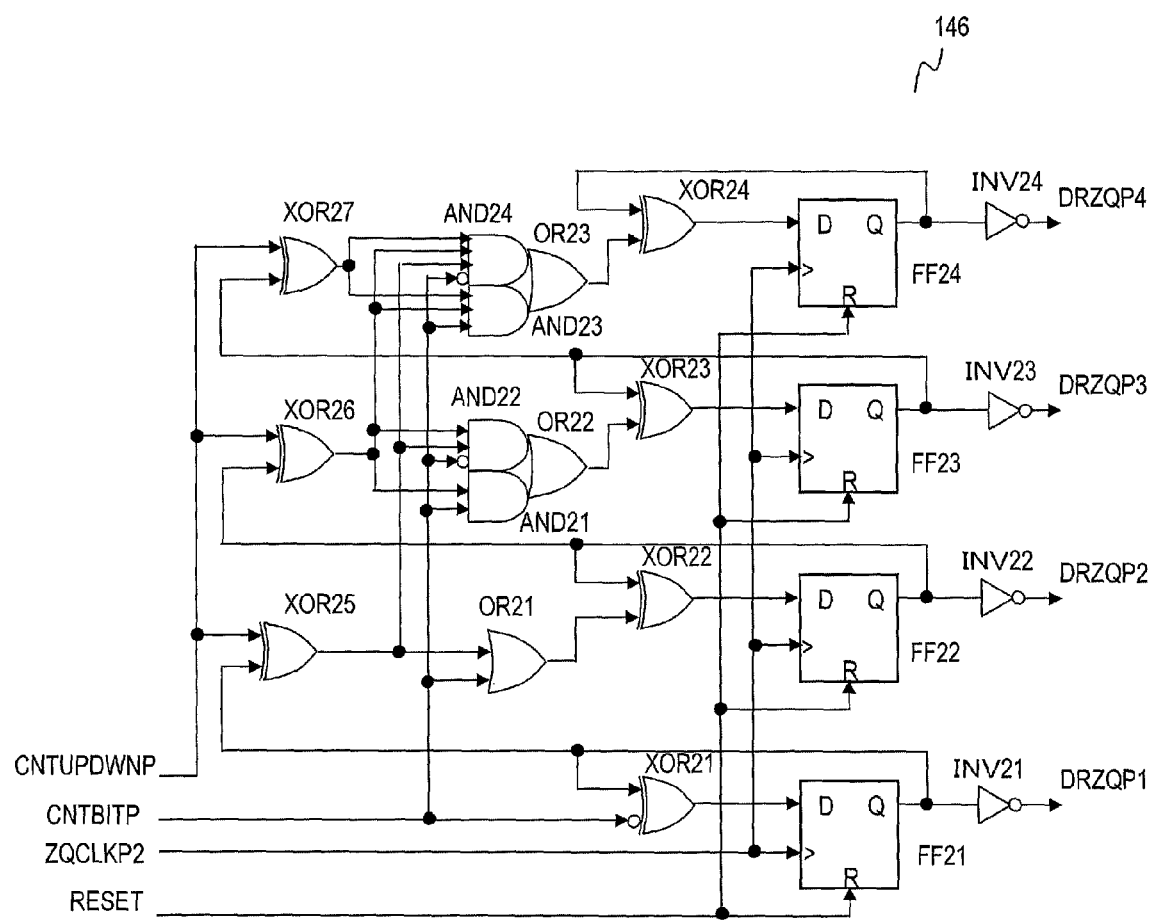
FIG. 6 is a circuit diagram of a counter circuit according to the Exemplary Embodiment of the present disclosure.

The counter circuit 146 will now be described. FIG. 6 depicts a circuit diagram of the counter circuit 146. An exclusive-OR circuit XOR2($k$+4) (k=1 to 3) inputs CNTUPDWNP at its one input end, while inputting an output of the flipflop FF2$k$ at its other input end. An OR circuit OR21 inputs CNTBITP at its one input end, while inputting an output of an exclusive-OR circuit XOR25 at its other input end.

An AND circuit AND21 performs the AND operation on CNTBITP and an output of an exclusive-OR circuit XOR26 and outputs the result of the operation to one input end of an OR circuit OR22. An AND circuit AND22 performs the AND operation on a logical inversion of CNTBITP and outputs of the exclusive-OR circuits XOR25 and XOR26 and outputs the result of the operation to the other input end of the OR circuit OR22. An AND circuit AND23 performs the And operation on CNTBITP and outputs of the exclusive-OR circuit XOR26 and an exclusive-OR circuit XOR27 and outputs the result of the operation to one input end of an OR circuit OR23. An AND circuit AND24 performs the AND operation on a logical inversion of CNTBITP and outputs of the exclusive-OR circuits XOR25, XOR26 and XOR27 and outputs the result of the operation to the other input end of the OR circuit OR23.

The exclusive-OR circuit XOR21 performs an exclusive-OR (XOR) operation on the output of the flipflop circuit FF21 and a logical inversion of CNTBITP to output an output signal to a D input of the flipflop circuit FF21. The exclusive-OR circuit XOR2($k$+1) (k=1 to 3) performs an XOR operation on an output of a flipflop circuit FF2$k$+1 and an output of the OR circuit OR2$k$ to output the result of the operation to a D input of the flipflop circuit FF2$k$+1.

The flipflop circuits FF2$m$ (m=1 to 4) are reset with the reset signal RESET being H in level to latch a value of a signal at D input with ZQCLKP2 being H in level to output impedance control signals DRZQPm.

Inverter circuits INV2$m$ (m=1 to 4) are provided in association with the flipflop circuits FF2$m$ (m=1 to 4) and invert the signals output from output nodes of the corresponding flipflop circuits FF2$m$ (m=1 to 4) to output the so inverted signals as impedance control signals DRZQPm (m=1 to 4). That is, the inverter circuits INV2$m$ (m=1 to 4) are operative to invert the count values of the counters to generate impedance control signals DRZQP1 to DRZQP4.

The counter circuit 146, arranged as described above, set the count values in a direction (countup or increment direction or a countdown or decrement direction), in keeping with the CNTUPDWNP from the decision circuit 144, by one bit or two bits conforming to CNTBITP.

It is now assumed that, in the impedance adjustment circuit 141, arranged as described above, the decision circuit 144 has concluded that the impedance of the replica buffer is appreciably offset from the target impedance value. In such case, the amount of change of the output impedance at one adjustment operation by which the decision circuit 144 causes the counter circuit 146 to change its count value is controlled to be equal to two bits of counter values. The DRZQP1, the least significant bit, is intact. It is then assumed that the decision circuit 144 has concluded that the impedance of the replica buffer is close to the target impedance value. In such case, the amount of change of the output impedance at one adjustment operation by which the decision circuit 144 causes the counter circuit 146 to change its count value is controlled to be equal to one bit of counter values. The DRZQP1, the least significant bit, is then also changed. In other words, if the potential level of the calibration terminal ZQ is higher in level than the reference voltage Vref4 or lower in level than the reference voltage Vref1, the impedance adjustment circuit 141 exercises control so that the amount of change of the output impedance at one adjustment operation by which the count value of the own counter is changed will be equal to two bits of counter values. If the potential level of the calibration terminal ZQ is somewhere between the reference voltages Vref4 and Vref3 or somewhere between the reference voltages Vref1 and Vref2, the impedance adjustment circuit 141 exercises control so that the amount of change of the output impedance at one adjustment operation by which the count value of the own counter is changed will be equal to one bit of counter values. If the potential level of the calibration terminal ZQ is somewhere between the reference voltages Vref3 and Vref2, the impedance adjustment circuit 141 exercises control so that the count operation of the own counter will be stopped. In short, the decision circuit 144 switches a changing manner in the count value of the own counter from two to one or vice versa depending on which one of the four potential areas defined by the reference voltages Vref1 to Vref4 is the potential area in which the potential level of the calibration terminal ZQ resides. That is, the decision circuit 144 switches the changing manner in the count value of the counter circuit 146 between the two steps and one step depending on which one of the multiple impedance value ranges is the impedance value range in which resides the impedance of the replica circuit 110, viz., depending on the difference between the impedance of the replica circuit 110 and the target impedance.

Figure 7A:
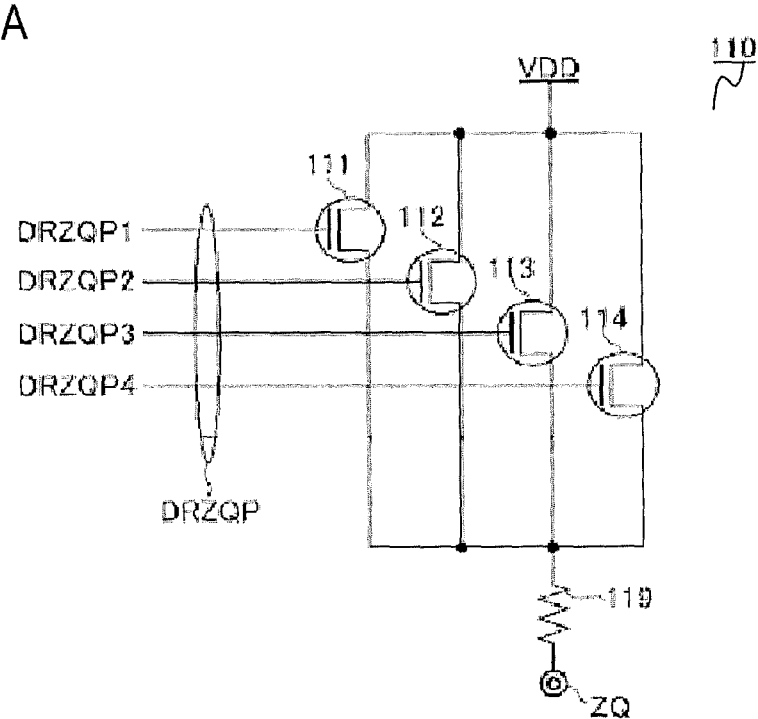
FIGS. 7A and 7B are circuit diagrams showing replica buffers according to the Exemplary Embodiment of the present disclosure.

As shown in FIG. 7A, the replica buffer 110 is composed by a parallel connection of four P-channel MOS transistors 111 to 114 and a resistor 119 having one end connected to the drains of the transistors. The other end of the resistor 119 is connected to the calibration terminal ZQ. The replica buffer 110 has just the pull-up function, that is, it has no pull-down function.

The impedance control signals DRZQP1 to DRZQP4 are respectively delivered from the impedance adjustment circuit 141 to the gates of the transistors 111 to 114. The four transistors, contained in the replica buffer 110, may thus be individually turned on or off. Note that, in FIGS. 2 and 3, the impedance control signals DRZQP1 to DRZQP4 are collectively denoted as DRZQP.

The parallel connection of the transistors 111 to 114 is configured for exhibiting a pre-set impedance of say 120Ω when in the conducting state. However, the on-resistance of a transistor is varied under the existing manufacture conditions or by the environmental temperature as well as by power supply voltages during the operation. Hence, a desired impedance value may not necessarily be obtained. Thus, to realize an actual impedance of 120Ω, it is necessary to adjust the number of the transistors that are to be turned on. Thus, a parallel connection of a plurality of transistors is used. It is observed that the resistance value of the resistor 119 is set at a design value of say 120Ω. Thus, when the parallel connection of the transistors 111 to 114 is in conducting state, the impedance of the replica buffer 110, when looking from the calibration terminal ZQ, is 240Ω.

The replica buffer 120 is of the same circuit configuration as that of the replica buffer 110 shown in FIG. 7A, except that the opposite end of the resistor 119 is connected to the node A. Hence, the impedance control signals DRZQP1 to DRZQP4 are fed to the gates of the four transistors contained in the replica buffer 120. In short, if the impedance of the replica buffer 110 is 240Ω, as discussed previously, the impedance of the replica buffer 120, when looking from the contact A, is also 240Ω.

Figure 7B:
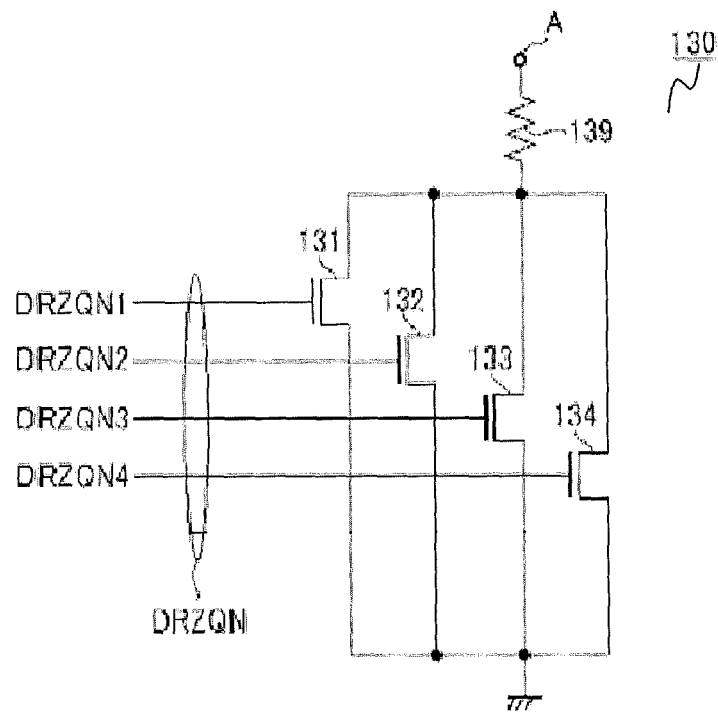

FIG. 7B depicts a circuit diagram of the replica buffer 130. Referring to FIG. 7B, the replica buffer 130 is composed by a parallel connection of four N-channel MOS transistors 131 to 134 and a resistor 139 having one end connected to the drains of these transistors. The opposite end of the resistor 139 is connected to the node A. The replica buffer 130 has just the pull-down function and has no pull-up function.

The gates of the transistors 131 to 134 are supplied from the impedance adjustment circuit 142 with the impedance control signals DRZQN1 to DRZQN4, respectively. The four transistors, contained in the replica buffer 130, may thus be controlled on/off individually. Note that, in FIGS. 2 and 3, the impedance control signals DRZQN1 to DRZQN4 are collectively denoted as DRZQN.

The resistance value of the parallel connection, composed by transistors 131 to 134, is designed to be 120Ω when the transistors are in on-states. The resistance value of the resistor 139 is set at 120Ω as well. Thus, when the parallel circuit, composed by the transistors 131 to 135, is in on-state, the impedance of the replica buffer 130, when looking from the contact A, is 240Ω like that of the replica buffers 110 and 120.

Figure 8:
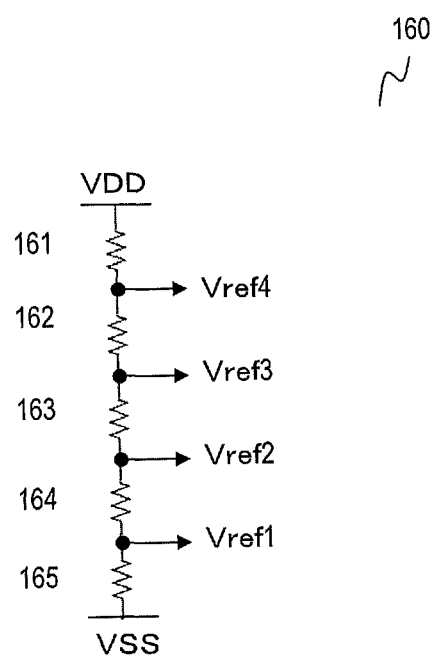
FIG. 8 is a circuit diagram showing a reference voltage generation circuit according to the Exemplary Embodiment of the present disclosure.

As shown in FIG. 8, the reference voltage generation circuit 160 is made up by a plurality of resistors 161 to 165 connected in series between the power supply potential VDD and the ground potential VSS. Reference voltages Vref1 to Vref4 may be taken out at respective taps of the resistors. A plurality of reference voltages Vref1 to Vref4 differing in level may thus be generated by the reference voltage generation circuit 160.

Figure 9:
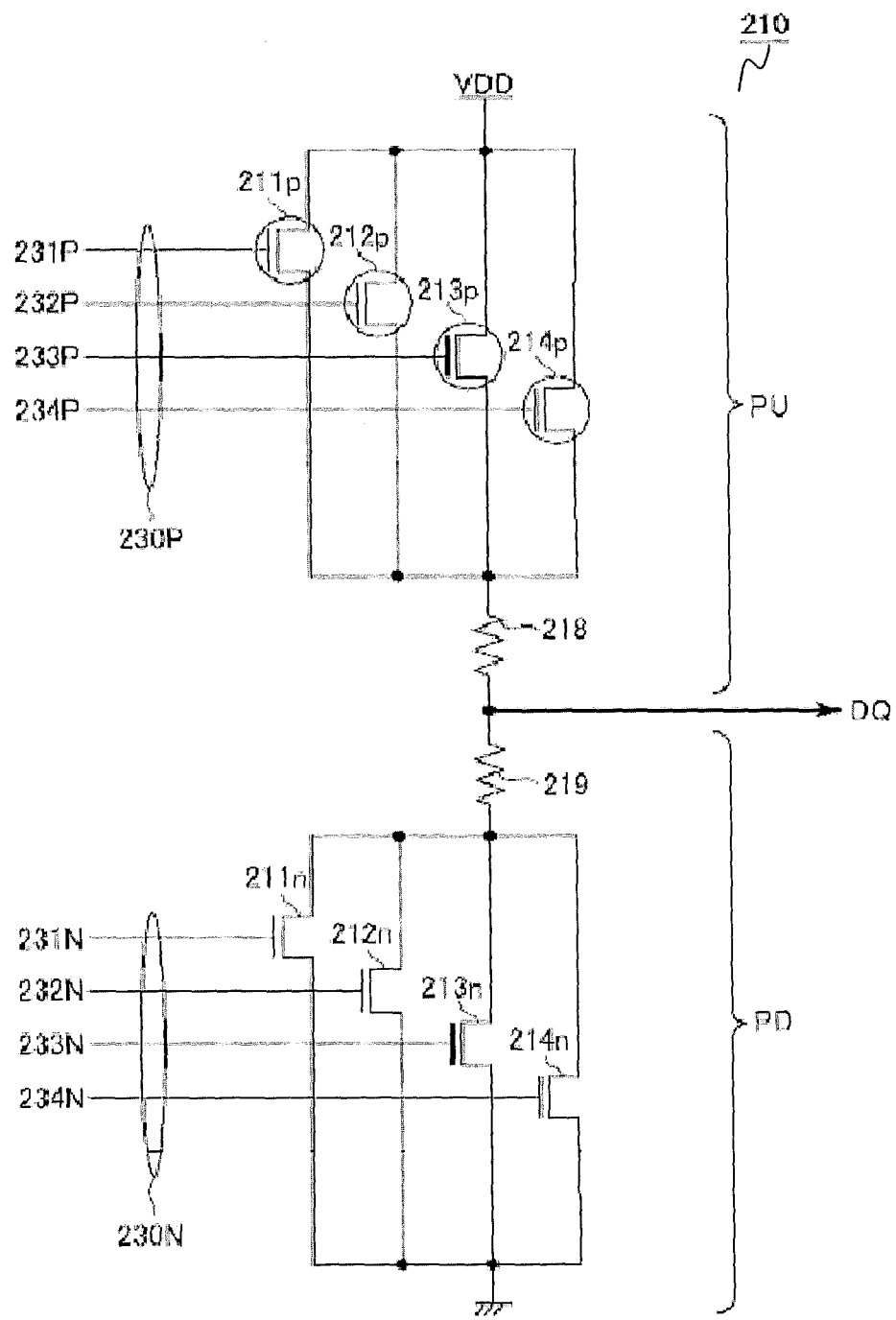
FIG. 9 is a circuit diagram showing an output buffer according to the Exemplary Embodiment of the present disclosure.

As shown in FIG. 9, the output buffer 210 includes a parallel connection of four P-channel MOS transistors 211p to 214p and a parallel connection of four N-channel MOS transistors 211n to 214n. A series connection of resistors 218, 219 is connected between the transistors 211p to 214p and the transistors 211n to 214n. A junction point of the resistors 218, 219 is connected to the data input/output terminal DQ.

Four operating signals 231P to 234P, making up the operating signal set 230P, are respectively delivered to the gates of the transistors 211p to 214p. On the other hand, four operating signals 231N to 234N, making up the operating signal set 230N, are respectively delivered to the gates of the transistors 211n to 214n. In this manner, the eight transistors contained in the output buffer 210 are individually controlled to be turned on/off by the eight operating signals 231P to 234P and 231N to 234N.

In the output buffer 210, the P-channel MOS transistors 211p to 214p and the resistor 218 make up a pull-up circuit PU which is of the same circuit configuration as that of the replica buffer 110 (120) shown in FIG. 3. On the other hand, the N-channel MOS transistors 211n to 214n and the resistor 219 make up a pull-down circuit PD which is of the same circuit configuration as that of the replica buffer 130 shown in FIG. 3.

Hence, the parallel circuit, made up of the transistors 211p to 214p, and the parallel circuit, made up of the transistors 211n to 214n, are designed to exhibit a resistance of 120Ω when the transistors are in on-states. On the other hand, the resistance values of the resistors 218, 219 are both designed to be 120Ω. Thus, in case the parallel circuit, made up of the transistors 211p to 214-p, or the parallel circuit, made up of the transistors, made up of the transistors 211n to 214n, is in on-state, the impedance of the output buffer, when looking from the data input/output terminal DQ, is 240Ω.

Figure 10:
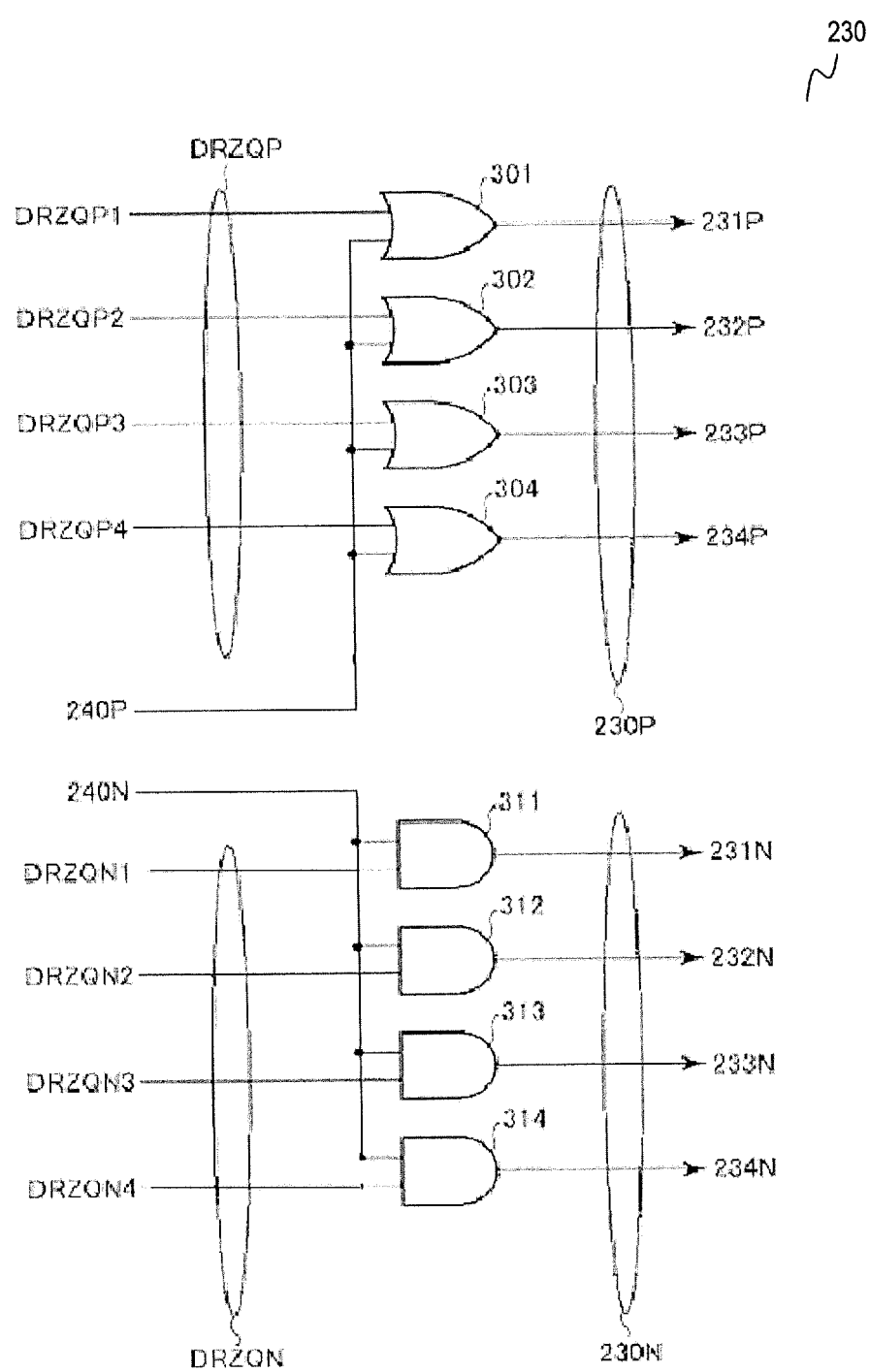
FIG. 10 is a circuit diagram showing a pre-stage circuit according to the Exemplary Embodiment of the present disclosure.

As shown in FIG. 10, the pre-stage circuit 230 is made up of four OR circuits 301 to 304 and four AND circuits 311 to 314. A selection signal 240P from the output control circuit 240 is supplied common to the OR circuits 301 to 304, to which the impedance control signals DRZQP1 to DRZQP4 from the calibration circuit 100 are also supplied. On the other hand, the selection signal 240N from the output control circuit 240 is supplied common to the AND circuits 311 to 314, to which the impedance control signals DRZQN1 to DRZQN4 from the calibration circuit 100 are also supplied.

The selection signals 240P, 240N, output from the output control circuit 240, are controlled in response to logical values or the like of data to be output from the data input/output terminal DQ. Specifically, the selection signals 240P, 240N are set at LOW levels in case an H level signal is output from the data input/output terminal DQ. The selection signals 240P, 240N are set at HIGH levels in case an L level signal is output from the data input/output terminal DQ. If an ODT (On Die Termination) function of using the output buffer 210 as the terminal resistor is used, the selection signals 240P and 240N are at LOW and HIGH levels, respectively.

The operating signals 231P to 234P (=230P), output from the OR circuits 301 to 304, and the operating signals 231N to 234N (=230N), output from the AND circuits 311 to 314, are supplied to the output buffer 210, as shown in FIGS. 2 and 9.

Figure 11:
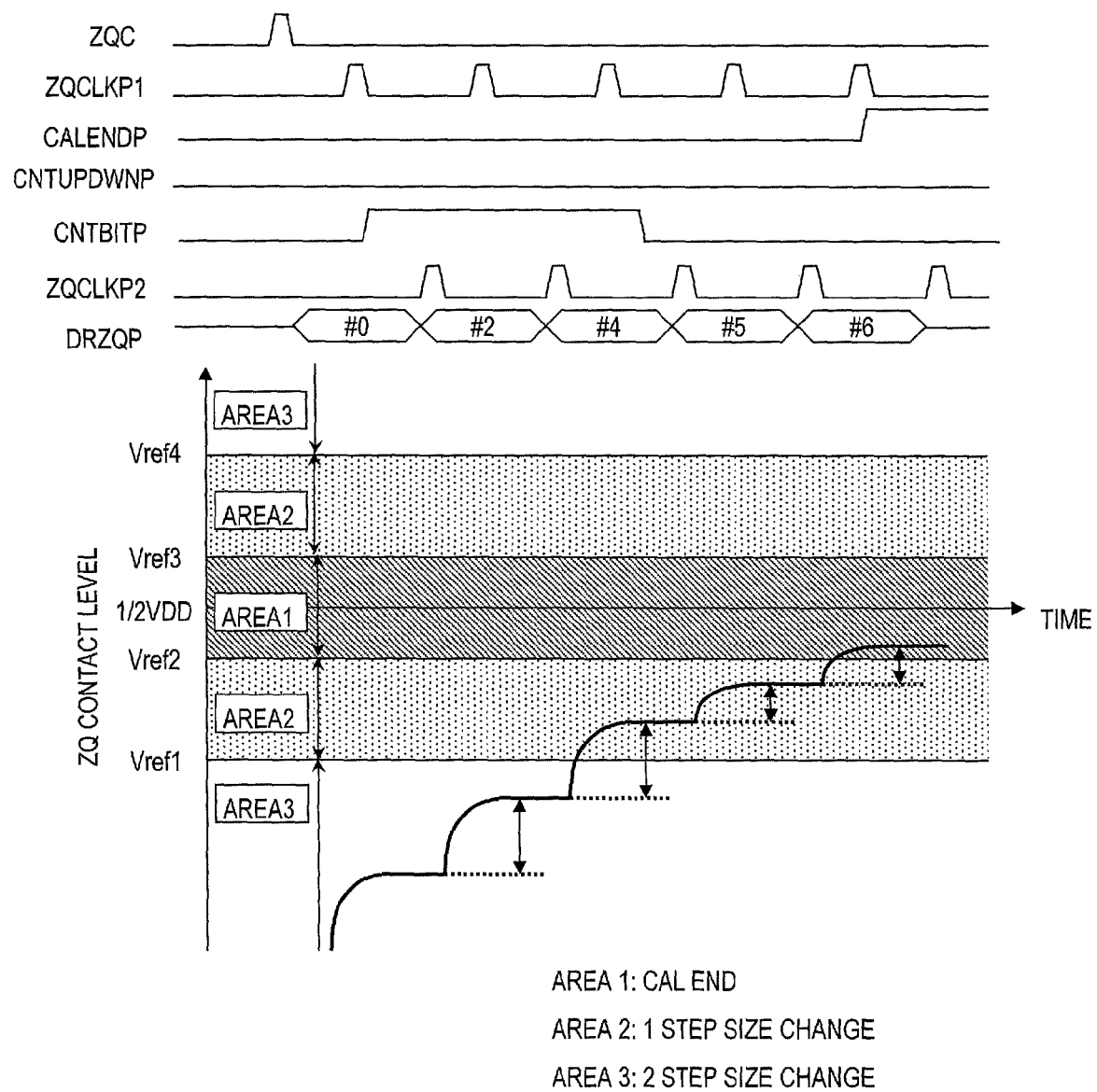
FIG. 11 is a waveform diagram showing waveforms at various portions of a semiconductor device according to the Exemplary Embodiment of the present disclosure.

An example calibration operation of the semiconductor device of the subject Exemplary Embodiment will now be discussed. FIG. 11 depicts a waveform diagram showing waveforms at different portions, and especially shows waveforms at various portions in case of the Pch side impedance adjustment and changes in the potential levels at the calibration terminal ZQ during Pch impedance adjustment.

Referring to FIG. 1, when a command indicating the calibration is delivered from outside, a ZQ command ZQC is delivered as an internal command iCMD from the control circuit 20 to the calibration circuit 100 of FIG. 2. The ZQ control circuit 170 of FIG. 3 performs clocking of ZQCLKP1, ZQCLKP2, in response to the ZQ command ZQC, and the decision circuit 144 of FIG. 4 effectuates a decision operation in timed relation to the ZQCLKP1. The decision circuit 144 sets CNTUPDWNP, CNTBITP at logic levels conforming to the result of decision, from one decision operation to another, and delivers the resulting signals to the counter circuit 146. The counter circuit 146 receives not only CNTUPDWNP and CNTBITP but also ZQCLKP2 and executes the count operation in synchronization with the ZQCLKP2 depending on the logical level of CNTUPDWNP and CNTBITP.

Referring to FIG. 11, the code of DRZQP starts with #0 to perform two-by-two countup. When the code reaches #4, the potential level of the calibration terminal ZQ exceeds Vref1. That is, the potential area shifts from area 3 to area 2. At this time, the countup changes to one-by-one countup. When the code reaches #6, the potential level of the calibration terminal ZQ exceeds Vref2, that is, the impedance of the replica buffer is in a target impedance value range, viz., in the area 1. Thus, at the next decision operation, the decision circuit 144 activates CALENDP to deliver the CALENDP activated to the ZQ control circuit 170. On reception of the CALENDP activated, the ZQ control circuit 170 stops clocking of ZQCLKP1 and ZQCLKP2 to terminate the calibration operation. By the ZQ control circuit 170 performing clocking of ZQCLKN1, ZQCLKN2 at the same time as it stops the clocking of ZQCLKP1, ZQCLKP2, the impedance adjustment on the Nch side may be executed, although this is not shown in the drawings. It is observed that the impedance adjustment on the Nch side is essentially the same as that on the Pch side and hence is not specifically explained.

In the above described calibration operation, the calibration adjustment step commences with a large amount of change of the output impedance of the output impedance at one adjustment operation, say 2. As the impedance approaches to the target impedance value, the amount of change of the output impedance of the output impedance at one adjustment operation is narrowed to say 1. It is thus possible to complete the calibration with the number of the adjustment steps smaller than before.

Exemplary Embodiment 2

A semiconductor device according to another Exemplary Embodiment of the present disclosure will now be discussed. The semiconductor device according to the other Exemplary Embodiment of the present disclosure differs from the Exemplary Embodiment 1 in using a calibration circuit 300 shown in FIG. 12 in place of the calibration circuit 100 shown in FIG. 3. Otherwise, the present Exemplary Embodiment 2 is substantially the same as Exemplary Embodiment 1.

Figure 12:
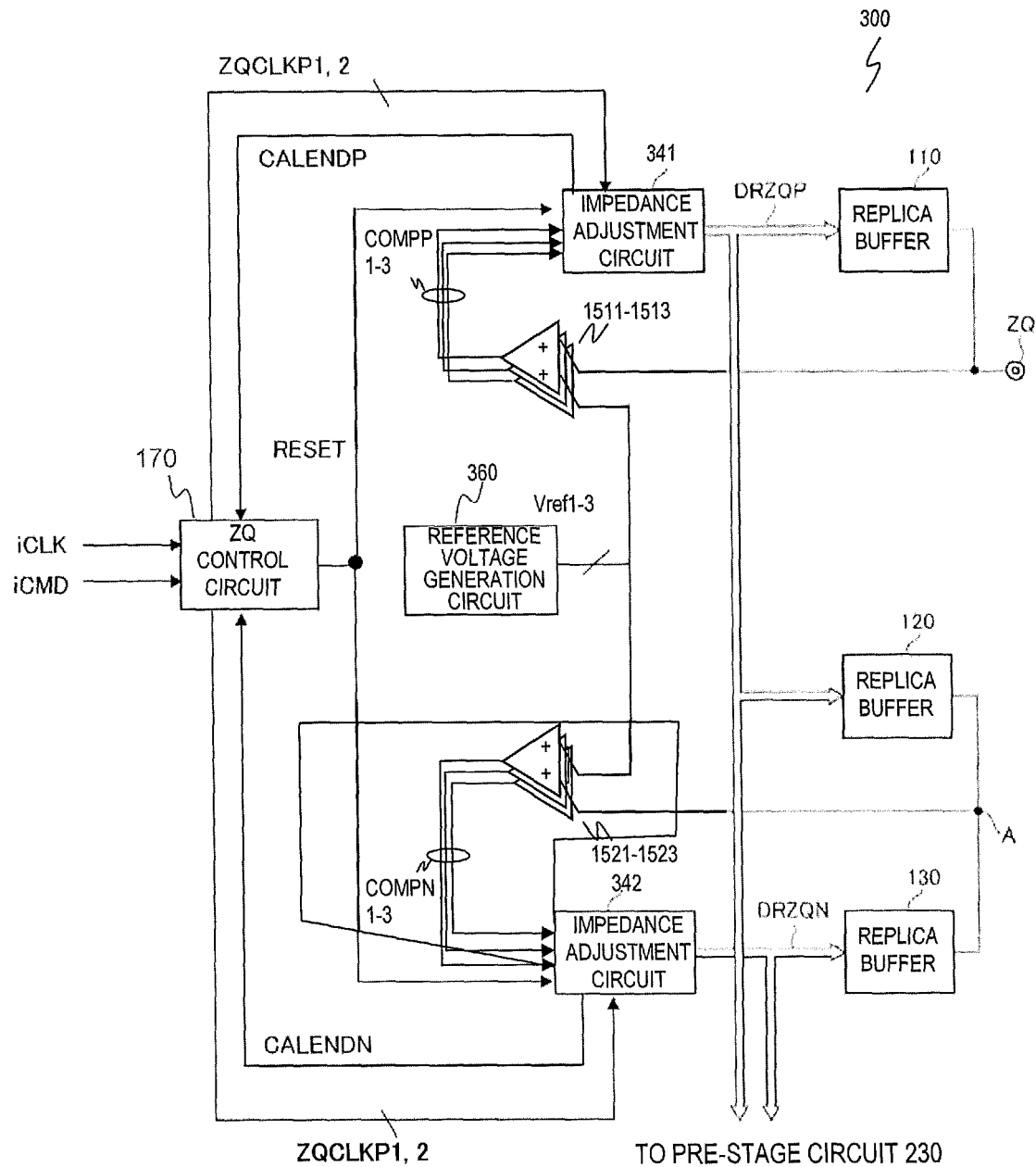
FIG. 12 is a circuit diagram showing the configuration of a calibration circuit according to another Exemplary Embodiment of the present disclosure.

As compared to the calibration circuit 100, shown in FIG. 3, the calibration circuit 300, shown in FIG. 12, differs in not including the comparator circuits 1514, 1524, in including a reference voltage generation circuit 360 in place of the reference voltage generation circuit 160, and in including impedance adjustment circuits 341, 342 in place of the impedance adjustment circuits 141, 142. The remaining component elements are essentially the same as the corresponding component elements of the calibration circuit 100 shown in FIG. 3. Hence, these component elements are indicated by the same reference symbols as those used in FIG. 3, and the corresponding description is dispensed with.

Figure 14:
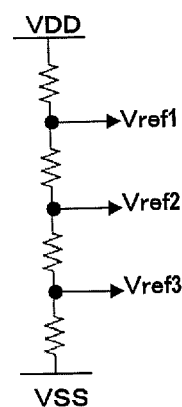
FIG. 14 is a circuit diagram of a reference voltage generation circuit according to the another Exemplary Embodiment of the present disclosure.

A reference voltage generation circuit 360 generates reference voltages Vref1 to Vref3, which are delivered to one comparator input terminals (−) of the comparator circuits 1511 to 1513, respectively, and to one comparator input terminals (−) of the comparator circuits 1521 to 1523, respectively. Specifically, the reference voltage generation circuit is configured as shown in FIG. 14. The voltage level of Vref2 is one-half the power supply voltage VDD, or ½VDD. In distinction from Exemplary Embodiment 1, the subject Exemplary Embodiment detects that the voltage level at the calibration terminal ZQ or that at the node A has intersected the ½VDD voltage level to terminate the calibration operation.

The impedance adjustment circuit 341, 342 will now be discussed. Each of the impedance adjustment circuits 341, 342 has a configuration similar to the configuration of the impedance adjustment circuit 141 (142) shown in FIG. 4 except that the decision circuit 144 as component part of the impedance adjustment circuit 141 (142) shown in FIG. 4 is replaced by a decision circuit 344 shown in FIG. 13. Otherwise, the impedance adjustment circuits 341, 342 are essentially similar to the impedance adjustment circuit 141 (142) of FIG. 4, and hence are not explained in detail for simplicity.

Figure 13:
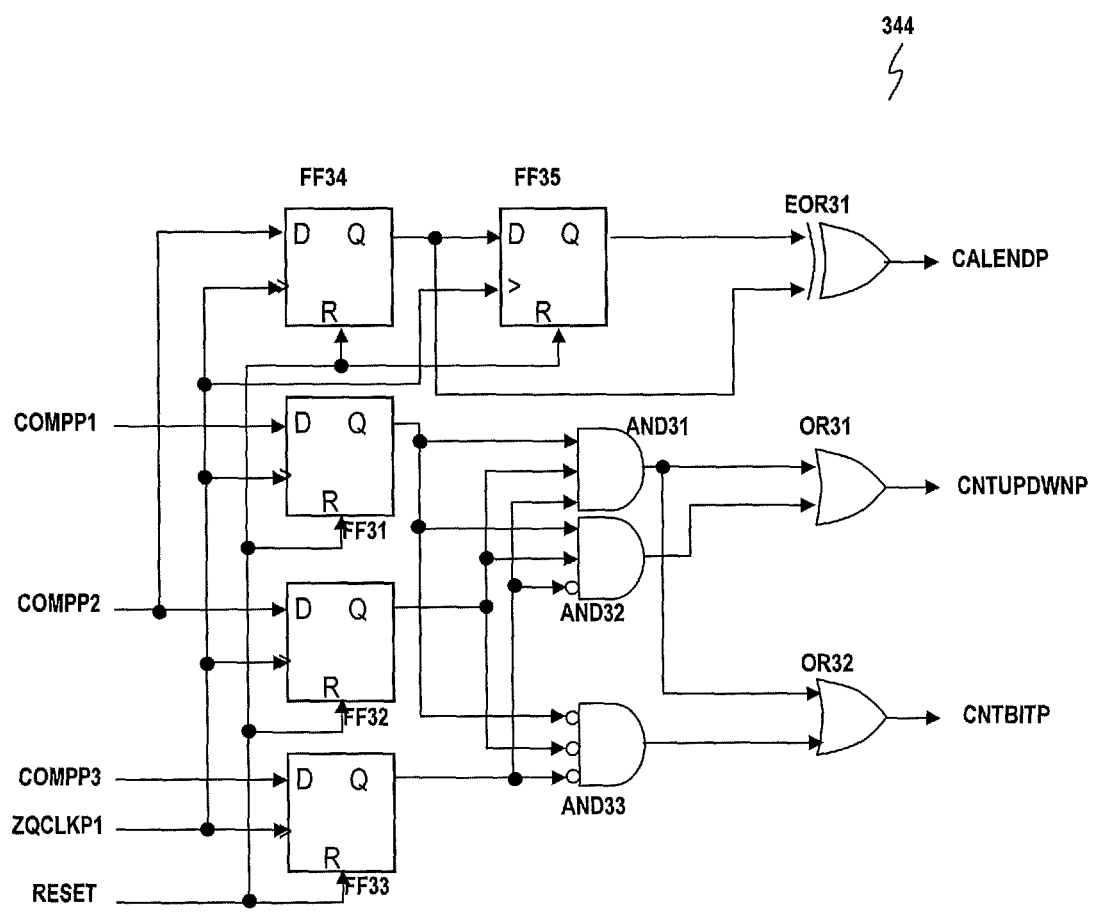
FIG. 13 is a circuit diagram of a decision circuit according to the another Exemplary Embodiment of the present disclosure.

FIG. 13 depicts a circuit diagram of the decision circuit 344. Referring to FIG. 13, flipflop circuits FF31 to FF33 are reset with the reset signal RESET being at H level, and latch the signals COMPP1 to COMPP3 in response to the signal ZQCLKP1. An AND circuit AND31 performs the AND operation on outputs of the flipflop circuits FF31 to FF33 and outputs the result of the operation to one input of an OR circuit 31 and to one input of an OR circuit OR32. An AND circuit AND32 performs the AND operation on outputs of the flipflop circuits FF31 and FF32 and a logical inversion of the output of the flipflop circuit FF33 and outputs the result of the operation to the other input of the OR circuit 31, which OR circuit 31 outputs a signal CNTUPDWNP. An AND circuit AND33 performs the AND operation on logical inversions of the outputs of the flipflop circuits FF31 to FF33 and outputs the result of the operation to the other input of the OR circuit OR32, which OR circuit OR32 outputs a signal CNTBITP.

The flipflop circuit FF34 is reset with the reset signal RESET being H in level, and latches the signal COMPP2 in response to the signal ZQCLKP1. The flipflop circuit FF35 is reset with the reset signal RESET being H in level, and latches the output of the flipflop circuit FF34 in response to the signal ZQCLKP1. An EOR circuit EOR31 performs an exclusive-OR operation on an output of the flipflop circuit FF34 and an output of the flipflop circuit FF35 to output the result of the operation as CALENDP.

The decision circuit 344, constructed as described above, has the function to generate CNTUPDWNP indicating, depending on the logical levels of the signals COMPP1 to COMPP3, the results of comparison at the comparator circuits 1511 to 1513, whether the operation of the subsequent stage counter circuit 146 is countup or countdown, that is, indicating the direction of the impedance adjustment. The decision circuit 344 also has the function to generate the signal CNTBITP indicating whether the subsequent stage counter circuit 146 is one step (one bit) change or two step change (two bits), viz., indicating the amount of change of the output impedance at one adjustment operation. In addition, the decision circuit has the function to generate CALENDP, indicating the end of the Pch side impedance adjustment, in response to a change in logical level of the signal COMPP2, the result of comparison by the comparator circuit 1512, specifically, a change in logical level of the signal COMPP2 from H level to L level or vice versa.

The advantage which is substantially the same as that of Exemplary Embodiment 1 may be obtained as well with the calibration circuit 300 configured as described above.

Figure 15:
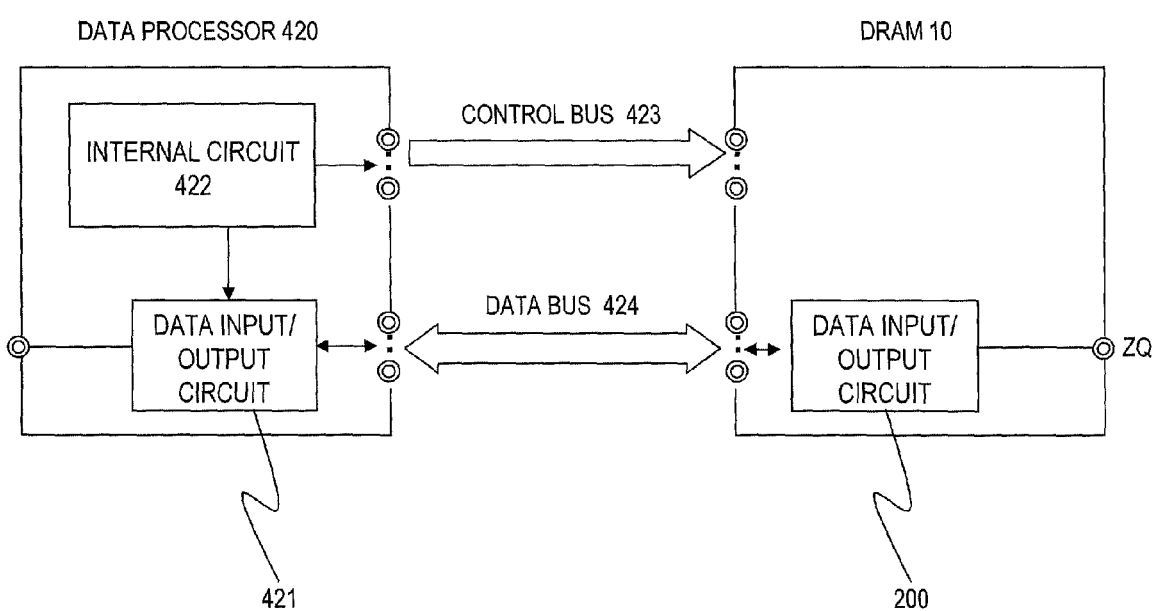
FIG. 15 is a block diagram of a memory system according to an Exemplary Embodiment of the present disclosure.

FIG. 15 is a block diagram showing the configuration of a memory system including a data processor 420 and a DRAM 10.

Referring to FIG. 15, the data processor 420 and the DRAM 10 are interconnected via a control bus 423 and a data bus 424. Of these, the control bus 423 is an interconnect on which control signals exemplified by clocks, commands or addresses are transferred from the data processor 420 to the DRAM 10. The data bus 424, on the other hand, is an interconnect on which data are communicated between the data processor 420 and the DRAM 10. The data are signals bidirectionally communicated between the data processor 420 and the DRAM 10. Hence, the data processor 420 also includes a data input/output circuit 421, as shown in FIG. 15. In the above discussions of the Exemplary Embodiments, the data input/output circuit 200 of the DRAM 10 has been set out in depth. However, the data input/output circuit 421 of the data processor 420 may also be endowed with the impedance adjustment function similar to that of the input/output circuit 200 of the DRAM 10.

The disclosures of the aforementioned patent Publications are incorporated by reference herein. The particular exemplary embodiments or Exemplary Embodiments may be modified or adjusted within the scope of the entire disclosure of the present invention, inclusive of claims, based on the fundamental technical concept of the invention. In addition, a variety of combinations or selection of elements disclosed herein, inclusive of elements of claims, Examples or drawings, may be made within the context of the claims. That is, the present invention may cover a wide variety of modifications or corrections that may occur to those skilled in the art in accordance with the entire disclosure of the present invention, inclusive of claims, and the technical concept of the present invention.

What is claimed is:

1. A device comprising:
    an output terminal;
    a first output circuit connected to the output terminal and being indicative of a first impedance; and
    an impedance adjustment circuit including:
        a first terminal,
        a first replica circuit coupled to the first terminal and being indicative of an first replica impedance,
        a reference voltage generation circuit generating a plurality of reference voltages that are different in potential level from each other,
        a plurality of first comparator circuits each including first and second input nodes, the first input node of each of the first comparator circuits being coupled to the first terminal, the second input node of each of the first comparator circuits receiving an associated one of the reference voltages, the first comparator circuits outputting a plurality of first comparison result signals, and
        a first adjustment signal generation circuit receiving the first comparison result signals, generating first impedance adjustment signals and supplying the first impedance adjustment signals to the first output buffer and the first replica circuit,
    the first output buffer changing the first impedance in response to the first impedance adjustment signals, and the first replica circuit changing the first replica impedance in response to the first impedance adjustment signals.

2. The device as claimed in claim 1, wherein the first output circuit drives, when activated, the output terminal to a first logic level with the first impedance.

3. The device as claimed in claim 1, wherein the first output circuit includes a first power node and a plurality of first output transistors coupled in parallel between the first power node and the output terminal, the first adjustment circuit includes a plurality of first output nodes from which the first impedance adjustment signals are respectively outputted, and each of the first output transistors includes a plurality of first gate electrodes each coupled to a corresponding one of the first output nodes of the first adjustment circuit.

4. The device as claimed in claim 1, further comprising a second output circuit connected to the output terminal and being indicative of a second impedance, and wherein the impedance adjustment circuit further comprises:
    a connection node,
    a second replica circuit coupled to the connection node, being indicative of a second replica impedance and receiving the first impedance adjustment signals,
    a third replica circuit coupled to the connection node and being indicative of a third replica impedance,
    a plurality of second comparator circuits each including third and fourth input nodes, the third input node of each of the second comparator circuits being coupled to the connection node, the fourth input node of each of the second comparator circuits receiving an associated one of the reference voltages, the second comparator circuits outputting a plurality of second comparison result signals, and
    a second adjustment signal generation circuit receiving the second comparison result signals, generating second impedance adjustment signals and supplying the second impedance adjustment signals to the second output buffer and the third replica circuit, and the second output buffer changes the second impedance in response to the second impedance adjustment signals, the second replica circuit changes the second replica impedance in response to the first impedance adjustment signals and the third replica circuit changes the third replica impedance in response to the second impedance adjustment signals.

5. The device as claimed in claim 4, wherein the first output circuit drives, when activated, the output terminal to a first logic level with the first impedance, the second output circuit drives, when activated, the output terminal to a second logic level with the second impedance, and the first logic level is different from the second logic level.

6. The device as claimed in claim 4, wherein the first output circuit includes a first power node and a plurality of first output transistors coupled in parallel between the first power node and the output terminal, the first adjustment circuit includes a plurality of first output nodes from which the first impedance adjustment signals are respectively outputted, and each of the first output transistors includes a plurality of first gate electrodes each coupled to a corresponding one of the first output nodes of the first adjustment circuit, the second output circuit includes a second power node and a plurality of second output transistors coupled in parallel between the second power node and the output terminal, the second adjustment circuit includes a plurality of second output nodes from which the second impedance adjustment signals are respectively outputted, and each of the second output transistors includes a plurality of second gate electrodes each coupled to a corresponding one of the second output nodes of the first adjustment circuit.

7. The device as claimed in claim 6, wherein each of the first output transistors is different in channel type from each of the second output transistors.

8. The device as claimed in claim 4, wherein the first output circuit includes a plurality of first output transistors of a first channel type, the second output circuit includes a plurality of second output transistors of a second channel type that is different from the first channel type, the first replica circuit includes a plurality of first replica transistors of the first channel type, the second replica circuit includes a plurality of second replica transistors of the first channel type, the third replica circuit includes a plurality of third replica transistors of the second channel type.

* * * * *